United States Patent
Massie

(10) Patent No.: US 11,767,932 B1
(45) Date of Patent: Sep. 26, 2023

(54) SPACER AND HOUSING APPARATUS

(71) Applicant: Global Plasma Solutions, Inc., Savannah, GA (US)

(72) Inventor: Ralph Helder Massie, Monroe, NC (US)

(73) Assignee: GLOBAL PLASMA SOLUTIONS, INC., Charlotte, NC (US)

( * ) Notice: Subject to any disclaimer, the term of this patent is extended or adjusted under 35 U.S.C. 154(b) by 0 days.

(21) Appl. No.: 17/559,383

(22) Filed: Dec. 22, 2021

Related U.S. Application Data

(60) Provisional application No. 63/129,219, filed on Dec. 22, 2020.

(51) Int. Cl.
*F16L 3/12* (2006.01)
*H05K 7/14* (2006.01)
*G01T 7/00* (2006.01)

(52) U.S. Cl.
CPC ............ *F16L 3/12* (2013.01); *H05K 7/14* (2013.01); *G01T 7/00* (2013.01)

(58) Field of Classification Search
CPC .............. F16L 3/12; H05K 7/14; G01T 7/00
See application file for complete search history.

(56) References Cited

U.S. PATENT DOCUMENTS

| | | | | |
|---|---|---|---|---|
| 9,354,158 B1* | 5/2016 | van Dijk | ............... | H01R 43/26 |
| 2012/0193086 A1* | 8/2012 | van Dijk | ............... | G01K 1/14 |
| | | | | 374/185 |
| 2014/0209799 A1* | 7/2014 | Waddell | ............... | H01J 43/02 |
| | | | | 250/336.1 |
| 2015/0013957 A1* | 1/2015 | Van Dijk | ............... | G01K 1/14 |
| | | | | 374/185 |
| 2017/0133189 A1* | 5/2017 | Waddell | ............... | H01J 27/022 |

OTHER PUBLICATIONS

Siemens duct temperature sensor youtube video by Controls & Systems dated Feb. 8, 2020, https://www.youtube.com/watch?v=oA5Cc89CGnk (Year: 2020).*
Global plasma solution GPS-iMeasured-D duct mount ion meter 2019 (Year: 2019).*
Tasseron Q Duct Flange video on youtube.com, "Q Duct Flange Overview" by Tasseron sensors, dated Oct. 16, 2017, https://www.youtube.com/watch?v=Dmc3eC1Zlbk (Year: 2017).*
Tasseron sensors and controls 2018 product catalog and Q-duct flange datasheet (Year: 2018).*
Lamatek duct gaskets product page dated Sep. 21, 2020, https://lamatek.com/catalogs/hvac/duct-gaskets (Year: 2020).*
Johnson controls CP-Pxx series duct mount CO2 transmitter product page issued on Dec. 6, 2010 (Year: 2010).*
Plasma air duct mounted ion sensor product submittal page dated 2018 (Year: 2018).*
Global plasma solution GPS-iMeasured-D duct mount ion meter product literature, (Year: 2019).*

* cited by examiner

*Primary Examiner* — Terrell L McKinnon
*Assistant Examiner* — Ding Y Tan
(74) *Attorney, Agent, or Firm* — Seth L. Hudson; Maynard Nexsen PC

(57) ABSTRACT

A spacer apparatus includes a base portion having a top portion and a bottom portion that extends outward to an outer edge. A bore is disposed within the base portion and extends from the top portion to the bottom portion of the base portion. An elongate hollow sleeve surrounds the bore and extends upwards from the base portion. A gasket is disposed around the elongate hollow sleeve.

14 Claims, 3 Drawing Sheets

SPACER AND HOUSING APPARATUS

CROSS-REFERENCE TO RELATED APPLICATIONS

This application claims priority to and the benefit of U.S. Provisional Application No. 63/129,219, filed Dec. 22, 2020, entitled "Spacer and Housing Apparatus", the disclosure of which is hereby incorporated by reference.

FIELD OF THE INVENTION

The present invention relates generally to a spacer apparatus, and more particularly to a spacer apparatus to ground a device, such as an ion measuring device, that is inserted through ductwork of an HVAC system. In another alternative embodiment, the present invention relates generally to a housing apparatus for isolating a device, such as an ion measuring device, from ductwork or a mounting point that houses electrical components of the device.

BACKGROUND OF THE INVENTION

In certain situations, access to air flowing through the ductwork of a heating, ventilation and air-conditioning (HVAC) system or the like needs to be obtained. For example, an ion measuring device requires access to the air flowing through the HVAC ductwork to perform a specific function, such as measuring the amount of ions inside the air handling system downstream of an ionization device. To provide an accurate reading, the ion measuring device needs to be inserted through a wall of the ductwork and into the air stream to provide the most accurate and reliable reading of the amount of ions in the airway.

Typically, the component parts of an ion measuring device are metal and the ductwork is composed of metal. If the ion measuring device is not installed properly, the metal parts of the ion measuring device contact the metal ductwork, thus grounding the ion measuring device, causing it not to function correctly or function entirely. As a result, a need exists for a spacer apparatus that can be engaged to a device that is inserted through a wall of metal ductwork to prevent grounding issues that would result in a nonfunctioning device or a device that does not function properly. More specifically, a need exists for a spacer apparatus that can be engaged to an ion measuring device that is inserted through a wall of metal ductwork to prevent grounding issues that would result in a nonfunctioning device or a device that does not function properly if installed incorrectly.

BRIEF SUMMARY OF THE INVENTION

According to an embodiment of the present invention, a spacer apparatus includes a base portion having a top portion and a bottom portion that extends outward to an outer edge. Two-pairs of opposed side portions extend upwardly from the outer edge. A bore is disposed within the base portion and extends from the top portion to the bottom portion of the base portion. An elongate hollow sleeve surrounds the bore and extends upwards from the base portion. A gasket surrounds a first end of the elongate hollow sleeve adjacent the base portion.

According to another embodiment of the present invention, the space apparatus includes a lip circumferentially surrounding the bore, wherein the first end of the elongate hollow sleeve is engaged to the lip and extends upward therefrom.

According to yet another embodiment of the present invention, the space apparatus includes a gasket that is generally circular and engaged to the lip.

According to yet another embodiment of the present invention, the space apparatus is composed of acrylonitrile butadiene styrene.

According to yet another embodiment of the present invention, the gasket of the spacer apparatus is composed of flexible foam.

According to yet an embodiment of the present invention, a housing apparatus includes a base portion having a top portion and a bottom portion that extends outward to an outer edge. Two-pairs of opposed side portions extend upwardly from the outer edge to an upper edge forming a cavity therein. A top portion is disposed on the upper edge and enclosing the cavity. A bore is disposed within the top portion and extends from the first side to the second side. An elongate hollow sleeve surrounds the bore and extends upwards from the top portion. A gasket surrounds a first end of the elongate hollow sleeve adjacent the base portion.

BRIEF DESCRIPTION OF THE DRAWINGS

The present invention is illustrated and described herein with reference to the various drawings, in which like reference numbers denote like method steps and/or system components, respectively, and in which.

DETAILED DESCRIPTION OF THE INVENTION

The present invention may be understood more readily by reference to the following detailed description of the invention taken in connection with the accompanying drawing figures, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention. Any and all patents and other publications identified in this specification are incorporated by reference as though fully set forth herein.

Also, as used in the specification including the appended claims, the singular forms "a," "an," and "the" include the plural, and reference to a particular numerical value includes at least that particular value, unless the context clearly dictates otherwise. Ranges may be expressed herein as from "about" or "approximately" one particular value and/or to "about" or "approximately" another particular value. When such a range is expressed, another embodiment includes from the one particular value and/or to the other particular value. Similarly, when values are expressed as approximations, by use of the antecedent "about," it will be understood that the particular value forms another embodiment.

Figure 1:
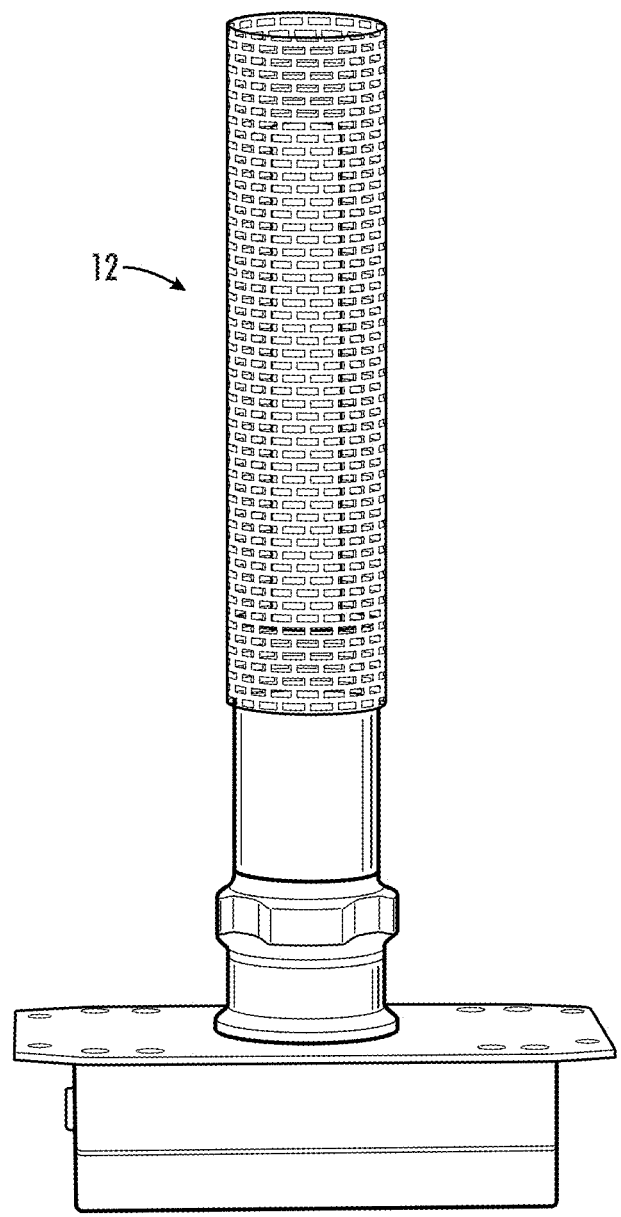
FIG. 1 is a side-perspective view of an exemplary ion measuring device.
Figure 2:
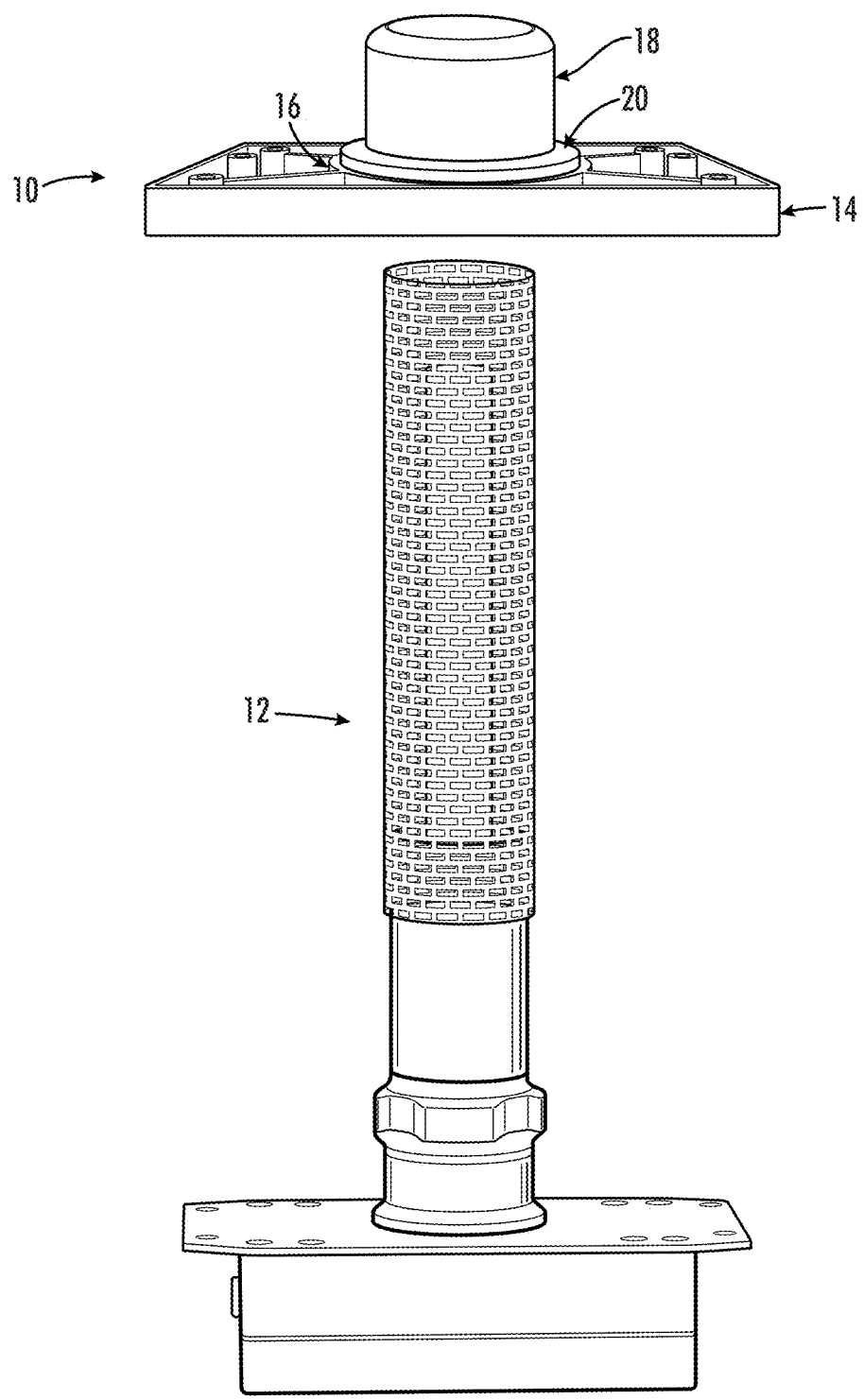
FIG. 2 is a side-perspective view of a spacer apparatus of the present invention being installed on the exemplary ion measuring device.
Figure 3:
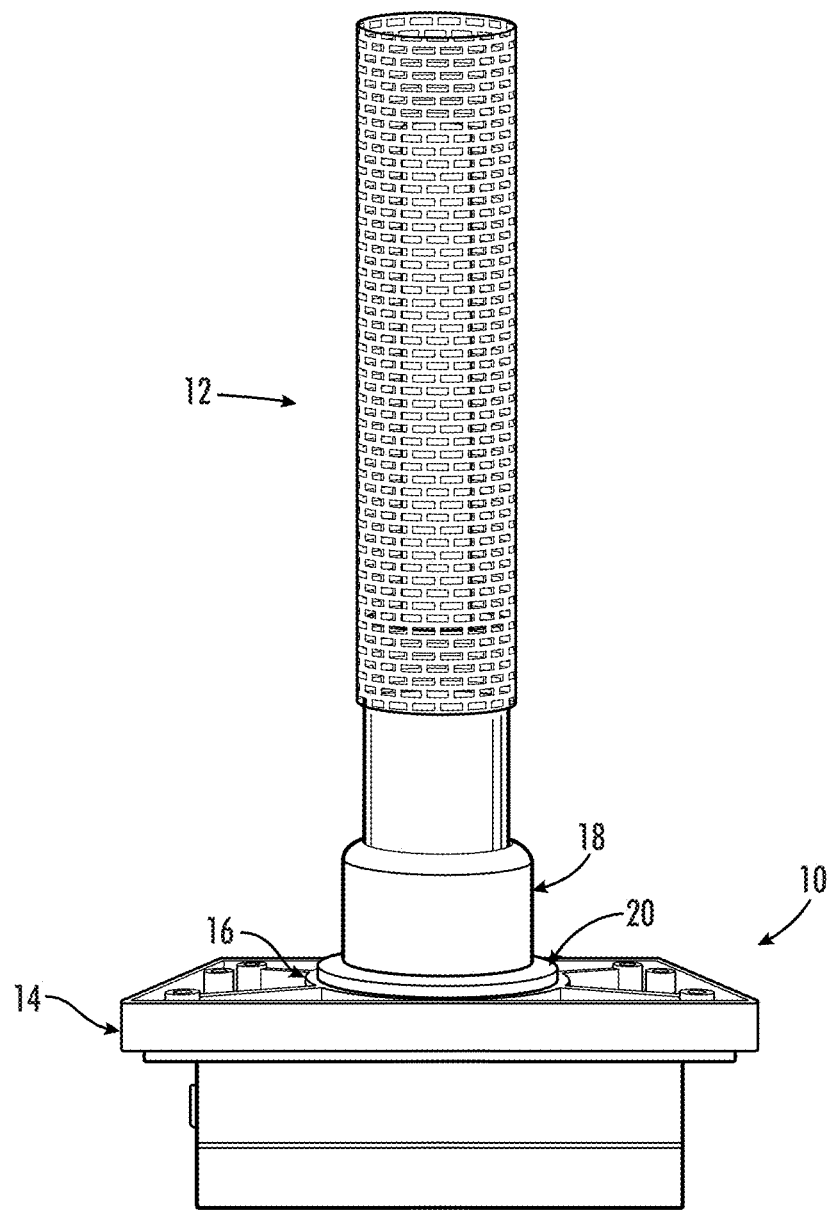
FIG. 3 is a side-perspective view of a spacer apparatus of the present invention being installed on the exemplary ion measuring device.

Referring now specifically to the drawings, and as illustrated in FIGS. 1-3, a spacer apparatus is shown generally at reference numeral 10 that may be engaged to a device, such as the ion measuring device 12 as shown in FIG. 1, and designed to be inserted through metal walls or substrates, such as HVAC ducts. The spacer apparatus 10 contains a base portion 14 having a top portion and a bottom portion and extends outwards to an outer edge. Two-pairs of opposed side portions extend upwardly from the outer edge.

The base portion 14 contains a bore extending therethrough from the top portion to the bottom portion. The bore is generally centrally located within the base portion 14, but the bore may be disposed at any location of the base portion 14 with the same desired effect and depending upon the device the spacer apparatus is intended to engage. A lip 16 is circumferently disposed around the bore and forms the side portions of the bore. As illustrated, the lip 16 extends upwardly from the top portion of the base portion 14 to a height generally equal to the height of the two-pairs of opposed side portions. It should be noted the lip 16 may extend to any height necessary or needed for the intended application of the spacer apparatus.

An elongate hollow sleeve 18 extends upwardly from the lip 16, wherein the first end of the sleeve is engaged to the lip 16 or top portion of the base portion 14. The elongate hollow sleeve 18 extends upwardly from the first end to a second end that contains an upper edge. The upper edge of the elongate hollow sleeve 18 may contain a tapered upper edge. The elongate hollow sleeve 18 is generally circular with an exterior surface and an interior surface and a hollow portion within the interior. The elongate hollow sleeve 16 has generally the same inside diameter as the bore. A generally circular gasket 20 is disposed on the lip 16 and adjacent the first end of the elongate hollow sleeve 18. The gasket 20 may be secured to the top surface of the lip 16 by an adhesive or the like.

The base portion 14, including the elongate hollow sleeve 18, may be composed of plastic, such as an acrylonitrile butadiene styrene (ABS) plastic. However, any other type of plastic or other material may be utilized for the present invention. The gasket 20 may be composed of a flexible foam, such as polyvinyl chloride flexible foam, or any other suitable material.

The exemplary ion measuring device 12, as shown in FIGS. 1-3, generally contains a base with a top plate for engaging the exterior wall of a duct, a collar extending upwards from the top plate of the base, and a measuring apparatus that extends upwards from an end of the collar. During use, an entry point, such as a hole, is formed within a wall of a duct. The measuring apparatus 12 is inserted through the hole, such that it is positioned within the air flow of the duct. The base is positioned external the duct with the top plate engaged to the external surface of the duct, while the collar is positioned within the hole and also extending into the duct. If the ion measuring device 12 is not installed properly, the collar may contact the duct, causing grounding issues and preventing the ion measuring device 12 from functioning or functioning properly. The spacer apparatus 10 is utilized to prevent any grounding issues during installation and serving as an insulator for the ion measuring device 12.

As shown in FIG. 2, the spacer apparatus 10 is placed "overtop" the ion measuring device 12, and specifically, the bore of the spacer apparatus 10 is placed "overtop" the cylindrical measuring apparatus. The bore of the spacer apparatus 10 contains a diameter larger than the diameter of the cylindrical measuring apparatus and collar. Likewise, the hollow central portion of the elongate hollow sleeve 18 contains a diameter larger than the diameter of the cylindrical measuring apparatus and collar. The spacer apparatus 10 slides downward, until the bottom portion of the base portion 14 of the spacer apparatus 10 contacts the top plate of the ion measuring device 12. In this position, the bore and sleeve 18 surround and preferably fully encompass the collar, as shown in FIG. 3. The spacer apparatus 10 prevents the metal components of the ion measuring device 12, such as the collar, from contacting the duct if the ion measuring device 12 is not installed correctly.

The base portion 14 of the spacer apparatus 10 may be engaged to the top plate of the base of the ion measuring device 12 by engagement devices, such as a screw, bolt, or the like. The base portion 14 contains connection bores that align with corresponding connection bores on the top plate for inserting a screw of the like for selectively securing the base portion 14 to the top plate. During use, the measuring apparatus is inserted into and through the hole of the duct. The top portion of the base portion 14 engages the external surface of the duct, while the sleeve 18 is positioned within the hole and extends within the duct. The top portion of the gasket 20, contacts the external surface of the duct, but also forms a seal, wherein it fills any void between the external surface of the sleeve 18 and the hole in the duct. In this arrangement, only portions of the spacer apparatus 10 contact any part of the duct, wherein the top portion of the base portion 14 engages the external surface of the duct, the sleeve 18 extends through the hole in the duct, and the gasket 20 fills any void between the sleeve 18 and hole, whereby it contacts the hole and external surface of the duct. As no metal portion of the ion measuring device 12 can contact the duct while the spacer apparatus 10 is engaged, any unintentional grounding from faulty installation is avoided.

A group of mounting bores are disposed on the top plate of the ion measuring device 12 that correspond to mounting bores disposed on the base portion 14. Engagement devices, such as a screw, bolt, or the like, are inserted through the mounting bores on the top plate of the ion measuring device 12 and base portion 14 and into the adjacent duct for securing the ion measuring device 12 and spacer apparatus 10 to the duct.

In an alternative embodiment (not shown), the present invention may serve as a housing apparatus for isolating a device, such as an ion measuring device, from ductwork or a mounting point that houses electrical components of the device. This embodiment contains the same structure as the embodiment described above and shown in FIGS. 2 and 3. However, the base portion of this alternative embodiment contains a cavity that houses electrical components, including a printed circuit board (PCB).

The cavity may be any shape that can sufficiently house electrical components. In one example, the base portion of extends to an outer edge and two-pairs of opposed side portions extend upwardly from the outer edge to an upper edge, forming a cavity therein. A top portion is disposed on the outer edge for providing a cover for the cavity. The base portion contains mounting points for mounting electrical components and a printed circuit board thereto. The top portion has a first side and a second side. A bore is disposed within the top portion and extends from the first side to the second side, providing access to the cavity. The bore is generally centrally located within the top portion, but the bore may be disposed at any location on the top portion. An optional lip is circumferently disposed around the bore and forms the side portions of the bore.

An elongate hollow sleeve extends upwardly from the lip, wherein the first end of the sleeve is engaged to the lip or the top portion. The elongate hollow sleeve extends upwardly from the first end to a second end that contains an upper edge. The upper edge of the elongate hollow sleeve may contain a tapered upper edge. The elongate hollow sleeve is generally circular with an exterior surface and an interior surface and a hollow portion within the interior. The elongate hollow sleeve has generally the same inside diameter as the bore. A generally circular gasket is disposed on the lip and adjacent the first end of the elongate hollow sleeve. The gasket may be secured to the top surface of the lip by an adhesive or the like.

This embodiment may replace portions of the ion measuring device 12, as illustrated in FIGS. 1-3. The base portion of this embodiment would replace the metal base of the illustrated ion measuring device 12 and house the electrical components, including the printed circuit board. Optionally, the collar of the ion measuring device 12 would be replaced with an elongate hollow sleeve as shown in FIGS. 2 and 3. The housing, including the elongate hollow sleeve, may be composed of plastic, such as an acrylonitrile butadiene styrene (ABS) plastic. However, any other type of plastic or other material that can electrically isolate the ion measuring device and prevent unintentional grounding may be utilized for the present invention. The gasket may be composed of a flexible foam, such as polyvinyl chloride flexible foam, or any other suitable material. In sum, the housing of the present invention composed of plastic or other electrically isolating material would eliminate the base, composed of aluminum, of the ion measuring device 12 and collar.

Although the present invention has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present invention and are intended to be covered by the following claims.

What is claimed is:

1. A spacer apparatus, comprising:
    a base portion having a top portion and a bottom portion that extends outward to an outer edge, two-pairs of opposed side portions extend upwardly from the outer edge to an upper edge, forming a cavity therein;
    a bore centrally located within the base portion and extending from the top portion to the bottom portion;
    a lip circumferentially surrounding the bore with a top surface;
    an elongate hollow sleeve surrounding the bore and extending upwardly from the lip to an upper edge, the elongate hollow sleeve is generally circular with an exterior surface and an interior surface; and
    a gasket.

2. The spacer apparatus according to claim 1, wherein the gasket is generally circular and is engaged to the top surface of the lip.

3. The spacer apparatus according to claim 1, wherein the spacer apparatus is composed of acrylonitrile butadiene styrene.

4. The spacer apparatus according to claim 1, wherein the gasket is composed of flexible foam.

5. A housing apparatus, comprising:
    a base portion having a top portion and a bottom portion that extends outward to an outer edge, two-pairs of opposed side portions extend upwardly from the outer edge to an upper edge forming a cavity therein, a top portion engages the upper edge and enclosing the cavity;
    a bore centrally located within the top portion and extending from a first side to a second side;
    a lip circumferentially surrounding the bore with a top surface;
    an elongate hollow sleeve surrounding the bore having a first end and a second end, wherein the first end is engaged to the lip and extending upwardly from the lip to the second end containing an upper edge, the elongate hollow sleeve is generally circular with an exterior surface and an interior surface; and
    a gasket is disposed on the top surface of the lip.

6. The housing apparatus according to claim 5, wherein the gasket is generally circular and is engaged to the top surface of the lip.

7. The housing apparatus according to claim 5, wherein the spacer apparatus is composed of acrylonitrile butadiene styrene.

8. The housing apparatus according to claim 5, wherein the gasket is composed of flexible foam.

9. A spacer apparatus for engaging an ion measuring device, comprising:
    a base portion having a top portion and a bottom portion that extend outward to an outer edge, two-pairs of opposed side portions extend upwardly from the outer edge to an upper edge, forming a cavity therein;
    a bore centrally located within the base portion and extending from the top portion to the bottom portion;
    a lip circumferentially surrounding the bore extending upwardly from the top portion of the base portion containing a top surface;
    an elongate hollow sleeve surrounding the bore having a first end and a second end, wherein the first end is engaged to the lip and extending upwardly from the lip to the second end containing an upper edge, the elongate hollow sleeve is generally circular with an exterior surface and an interior surface;
    a gasket is disposed on the top surface of the lip; and
    connection bores are disposed within the base portion that align with corresponding connection bores on a top plate of the ion measuring device for selectively securing the base portion to the top plate of the ion measuring device.

10. The spacer apparatus according to claim 9, wherein the gasket is generally circular.

11. The spacer apparatus according to claim 9, wherein the spacer apparatus is composed of acrylonitrile butadiene styrene.

12. The spacer apparatus according to claim 9, wherein the gasket is composed of flexible foam.

13. The spacer apparatus according to claim 9, wherein the lip has a height generally equal to a height of the two-pairs of opposed side portions.

14. The spacer apparatus according to claim 9, wherein the upper edge of the elongate hollow sleeve is tapered.

* * * * *